US006753120B2

(12) United States Patent
Kim

(10) Patent No.: US 6,753,120 B2
(45) Date of Patent: Jun. 22, 2004

(54) ALIGNMENT MEASURING METHOD OF PHOTOLITHOGRAPHY PROCESS

(75) Inventor: Hong Seok Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 214 days.

(21) Appl. No.: 10/151,163

(22) Filed: May 21, 2002

(65) Prior Publication Data

US 2003/0098977 A1 May 29, 2003

(30) Foreign Application Priority Data

Nov. 27, 2001 (KR) .......................................... 2001-74098

(51) Int. Cl.⁷ ................................................. G03F 9/00
(52) U.S. Cl. .......................................... 430/30; 430/22
(58) Field of Search ............................. 430/22, 30, 329

(56) References Cited

U.S. PATENT DOCUMENTS 6,210,846 B1 * 4/2001 Rangarajan et al. .......... 430/30
6,358,676 B1 * 3/2002 Wu ............................. 430/329

\* cited by examiner

*Primary Examiner*—Christopher G. Young
(74) *Attorney, Agent, or Firm*—Volentine Francos, PLLC

(57) ABSTRACT

The invention relates to an alignment measuring method of a photolithography process by which a misalignment degree for each shot region of a wafer is indexed to improve the accuracy of determining the possibility of overlay defects. The method includes: measuring the overlay state of each pattern image transcribed to every shot region of a wafer; counting the number of shot regions judged as overlay defects with the misalignment amount of each measured shot region; calculating in percentage the number of shot regions judged as overlay defects against the number of total shot regions of the wafer; and comparing the calculated percentage value with a preset value to determine the possibility of rework. Accordingly, it is possible to estimate the misalignment amount of the unmeasured shot regions with that of the sampled and measured shot regions, determine the possibility of overlay defects of each shot region and determine quickly and conveniently the need to rework, thereby shortening the time of manufacturing semiconductor devices, improving reliability of judgment on rework due to exclusion of a worker's personal judgment and making progress in cost effectiveness of rework and manufactured yield.

11 Claims, 7 Drawing Sheets

ALIGNMENT MEASURING METHOD OF PHOTOLITHOGRAPHY PROCESS

CROSS REFERENCE TO RELATED APPLICATIONS

This application claims benefit of Korea Patent Application No. 2001-74098, filed on Nov. 27, 2001, under 35 U.S.C. §119, the entirety of which is hereby incorporated by reference for all purposes as if fully set forth herein.

BACKGROUND

1. Field of the Invention

The present invention relates to a method of measuring alignment of a photolithography process, and more particularly, to an alignment measuring method of a photolithography process by which a degree of misalignment for each shot region of a wafer is indexed, to more accurately determine whether an overlay fails.

2. Brief Description of Related Art

In general, a photolithography process is used to transcribe onto a wafer different pattern images formed on a plurality of reticles. The pattern images are sequentially transcribed and compounded onto the wafer, along with etching, layer deposition and other processing steps, to form a desired circuit pattern.

In such a photolithography process, it is important to design a precise circuit pattern and accurately align (or overlay) different pattern layers forming the circuit pattern. For high-precision overlay of pattern layers, great efforts have been made to overcome a number of restrictions to form a circuit pattern with high-integration and high-precision by revising patterns of reticles and changing photoresist.

At this time, the dimension of patterns is usually determined by the specifications of the equipment and photoresist. However, the overlay of pattern images should be improved by periodical preventive maintenance and continuous development of measurement tools.

An overriding goal for the overlay step is to precisely overlay a pattern layer of transcribed pattern images with a pre-existing pattern layer as precisely as possible. In other words, the overlay of pattern layers is measured to make a standard database to determine whether another operational step, like a development step, should follow, or a re-alignment or maintenance should be performed to compensate for misalignment of the pre-existing pattern layer.

Therefore, there should be a database for a precise overlay of pattern layers. However, there is a problem in the overlay of pattern layers because respectively different formation relationships of align-marks have been used as a standard reference for transcription of pattern images in equipment. Besides, different overlay detection results may be obtained with the same align-marks in different equipment. Above all, the biggest problem has been that parameters mixed with linear and non-linear factors have been used for the overlay of pattern layers.

At this time, the aforementioned linear parameters include a level of misalignment along an X axis and Y axis of pattern images transcribed to the pre-existing pattern of a wafer, an expansion or contraction rate of an edge away from the center of a pattern, a degree of rotational angle and the like. The nonlinear parameters co-existing with the linear parameters as such are a level of misalignment of a pre-existing pattern, a level of precision in align-marks, an error in measurement equipment, and the like. It is required that the linear and non-linear parameters be separately analyzed on wafers or reticles, over again.

According to conventional overlay management with linear and non-linear parameters, a measurement has been taken regarding a level of the overlay of pattern images transcribed to a pre-existing pattern layer from respective shot regions of wafer, or a plurality of align-marks distributed instead of the shot regions. At this time, the amount of misalignment is calculated separately for a wafer field and a reticle field. While the calculation as such is performed with already measured data, the calculation is performed by correcting the misalignment with reference to the center of a wafer in the case of a wafer field, and with reference to the center of a reticle in the case of a reticle field.

According to the above-referenced method, there are various formulas for calculating the amount of misalignment in each shot region of a wafer field and the amount of misalignment in a reticle field. For the purpose of this disclosure, however, the amount of misalignment in the wafer field and the reticle field will be calculated only with formula 1 and formula 2, as examples:

Formula 1:

$$Xraw = a + bx - cy + \epsilon;$$

$$Yraw = d + ey + fx + \epsilon; \text{ where}$$

Xraw = the amount of misalignment that is measured relative to the x axis

Yraw = the amount of misalignment that is measured relative to the y axis x = the distance along the x axis from the center of a wafer y = the distance along the y axis from the center of a wafer a = the distance of pattern images in a direction of x axis b = the scale of enlargement of pattern images relative to x axis c = the obliquity factor of the rotation angle of pattern images in a direction of x axis relative to y axis d = the distance of pattern images in a direction of y axis e = the scale of enlargement of pattern images relative to y axis f = the obliquity factor of the rotation angle of pattern images in a direction of y axis relative to x axis $\epsilon$ = error term (non-linearity element)

In the formula 1, if the terms a, b, c, d, e and f in each shot region are partial-differentiated so that the square value of the term $\epsilon$ may be minimized, the following 3 simultaneous equations for each of Xraw and Yraw are obtained as in formula 2.

Formula 2:

$$L = \Sigma \epsilon^2 = \Sigma (Xraw - a - bx + cy)^2$$

$$\frac{\partial L}{\partial a} = -2 \sum (raw - a - bx + cy) = 0$$

$$\frac{\partial L}{\partial b} = -2 \sum (raw - a - bx + cy)x = 0$$

$$\frac{\partial L}{\partial c} = -2 \sum (raw - a - bx + cy)y = 0$$

$$L=\Sigma\epsilon^2=\Sigma(Yraw-d-ey-fx)^2$$

$$\frac{\partial L}{\partial d} = -2\sum (Yraw-d-ey-fx) = 0$$

$$\frac{\partial L}{\partial e} = -2\sum (Yraw-d-ey-fx)y = 0$$

$$\frac{\partial L}{\partial f} = -2\sum (Yraw-d-ey-fx)x = 0$$

L=least-scale

If the above simultaneous equations are solved by using the Gauss-Jordan' elimination method, the overlay variables for each of the shot regions, i.e., the values of a(1~n), b(1~n), c(1~n), d(1~n), e(1~n) and f(1~n) in formulas 1 and 2 can be obtained.

At this time, another method can also be used to obtain the aforementioned simultaneous equations.

Accordingly, a relationship of overlay variables relative to the amount of misalignment will be described in further detail with reference to the accompanying drawings.

First of all, a and d indicated in formula 1 are, as shown in FIG. 1, respective distances apart from x and y axes (an intercept between x and y axes). If there is a misalignment relative to a simple position, the intercept will be kept constant as a total vector of the misalignment amount regardless of a position in a wafer.

Also, b and e indicated in formula 1 are, as shown in FIG. 2, an enlargement rate relative to x and y axes respectively (an enlargement/reduction ratio according to a regression formula). The misalignment amount increases or decreases in a constant proportional relationship depending upon a degree of distance apart from the center of a wafer to its edge.

Furthermore, c and f indicated in formula 1 are, as shown in FIG. 3, a rotational angle slope to an x axis direction relative to a y axis according to a regression formula, increasing or decreasing in a constant relationship depending upon the distance apart from the center of a wafer to its edge. At this time, if a value of the rotational angle slope is marked as (+), it means a counterclockwise direction.

Furthermore, all the aforementioned parameters shown in FIGS. 1 through 3 are combined, resulting in a shape shown in FIG. 4.

With such a result, a worker can determine whether the misalignment amount relative to respective shot regions falls within a preset range and, then, decide with reference to the result whether the following processes will be performed or not.

At this time, the aforementioned decision about the following processes is to minimize the possible misalignment amount. Therefore, the statistical values on the misalignment amount measured on respective shot regions are used as correction data.

In FIG. 4, area A falls in a preset range of misalignment, but area B falls out of a preset range of misalignment. At this time, if the number of shot regions in area A is compared with the total number of shot regions and is determined to be over a preset number, it will be decided that all other processes, including an enlargement, should follow. On the contrary, if the resultant number of "good" shot regions is determined to be under a preset number, its relevant misalignment amount is used as a correction value for rework.

In addition, FIG. 6 is a three-dimensionally visualized instance for illustrating a relationship of respective parameters, a statistical image on respective shot regions obtained by the aforementioned formulas. At this time, x and y axes are distances apart from the center of a wafer relative to respective coordinates of shot regions, and the z axis is a misalignment amount against the x or y axis obtained by actual measurements.

At this time, an intercept to the z axis is an error distance relative to an x or y axis, a slope to the x axis means an enlargement rate with respect to the x axis and a rotational angle with respect to the y axis. Also, a slope to the y axis means a rotational angle with respect to the x axis and an enlargement rate with respect to the y axis.

Besides, h and l indicate a preset range of misalignment amount, and a disc shape of T shown between h and l indicates a misalignment amount measured on a shot region. In T, part T' beyond a preset range (h or l) of misalignment amount indicates an overlay defect the same as area B shown in FIG. 4.

However, overlay variables a, b, c, d, e, f are not described with a constant value relative to respective shot regions. If the misalignment amount of respective shot regions is shown with overlay variables, there may be a case that shows a shape shown in FIG. 5 as an example.

In such a case, even if the statistical misalignment amount falls in the preset range, the overlay variables relative to respective shot regions may be out of the preset range, which means that the number of shot regions causing overlay defects can be over a preset amount.

At this time, the number of shot regions out of the preset range, that is, in need of rework, is difficult to determine and to be utilized as correction data.

Furthermore, the overlay variables cannot be used as correction data because the overlay variables a, b, c, d, e relative to respective shot regions have an inter-relationship to cause a difficulty in application of accurate correction values.

Accordingly, in the case of the preset range of misalignment amount relative to shot regions of the wafer, as described above, it is difficult to interpret the possibility of defects with statistical data and much time is spent in analysis of statistical data. Also, the preset range is unnecessarily narrow, leading to an incorrect determination on an overlay defect. Besides, a worker has frequently made personal judgments because it is difficult to make a clear correction with overlay variables.

As described above, there have been problems of causing an unnecessary waste of time for a worker's judgment, reducing the reliability of experienced judgment and increasing the re-processing rate, but deteriorating the manufacturing yield because of a worker's judgment errors, such as when good products are wrongly judged as bad ones or when bad products are wrongly judged as good.

On the other hand, as described above, the calculation for the reticle field is made basically in the same method as that for the wafer field, but there is a difference in that the coordinates are converted to focus on reticles in actual measurement. Besides, the calculation is made after error components of a wafer are eliminated prior to an actual calculation.

SUMMARY OF THE INVENTION

It is an object of the present invention to solve the aforementioned problems of the prior art and provide an alignment measuring method of a photolithography by which the rate of processing failures on a wafer can be easily checked with a calculation formula illustrating the degree of alignment defects caused by photo-exposure, thereby reducing the frequency of a worker's personal judgment and the unnecessary rate of reworks or processing steps is reduced by an easy judgment.

In order to accomplish the aforementioned object of the present invention, there is provided an alignment measuring method of a photolithography process in accordance with an embodiment of the present invention, the method comprising the steps of: measuring the overlay state of each pattern image transcribed to every shot region of a wafer; counting the number of shot regions judged as overlay defects with the misalignment amount of each measured shot region; calculating in percentage the number of shot regions judged as overlay defects against the number of total shot regions of the wafer; and comparing the calculated percentage value with a preset rate to determine the possibility of rework.

On the other hand, there is provided another alignment measuring method of a photolithography process in accordance with another embodiment of the present invention, the method comprising the steps of: measuring the overlay state of a pattern image transcribed to each shot region, sampled in a predetermined number out of the total shot regions of a wafer; obtaining overlay variables respectively to all the shot regions sampled with measured misalignment amount; obtaining overlay variables respectively with misalignment degrees of all the sampled shot regions and estimating the misalignment degree to the rest shot regions excluded out of the sampling process by using the obtained overlay variables; counting the number of shot regions determined as overlay defects with the misalignment degree of the sampled shot regions and the estimated misalignment degree of the rest shot regions excluded during the sampling process; calculating the number of shot regions determined as overlay defects in percentage against the number of total shot regions on the wafer; and comparing the obtained percentage value with a preset rate for judgment on possibility of rework.

Also, it is preferable that, in the measurement of the shot regions, each alignment degree should be obtained by separately comparing the center and edge coordinates of a shot region of a pre-existing pattern layer with those of a correspondingly transcribed pattern image.

Furthermore, it is preferable that the overlay defects of shot regions are determined with any misalignment amount that is out of a preset range when the misalignment amounts are obtained by separately comparing the center and edge coordinates of a shot region of a pre-existing pattern layer with those of a correspondingly transcribed pattern image.

On the other hand, the misalignment amount of the remainder of the shot regions excluded in the sampling process can be obtained by applying respective coordinate values used in calculation for the misalignment amount, including overlay variables relative to the closely sampled shot regions.

Furthermore, linear and non-linear misalignment components of all of the shot regions are stored as data and statistically calculated to be used as alignment correction values for the following photo-exposure.

DETAILED DESCRIPTION OF THE INVENTION

Hereinafter, a description will be made on an alignment measuring method of a photolithography process with reference to accompanying drawings in accordance with the present invention.

Figure 1:
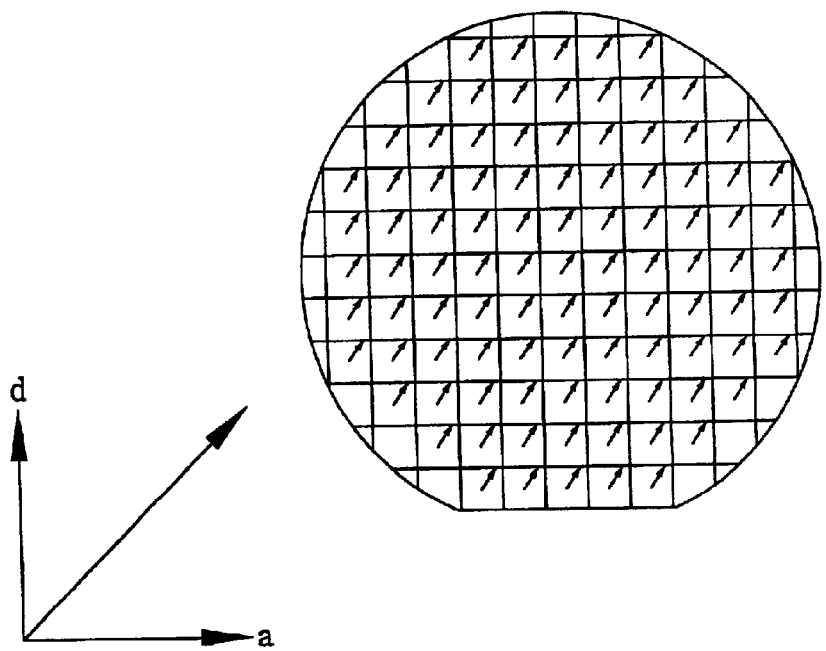
FIGS. 1 through 3 are plans for schematically illustrating the relationship of overlay variables relative to coordinates of respective shot regions with misalignment degrees obtained by the result of overlay measurements.
Figure 2:
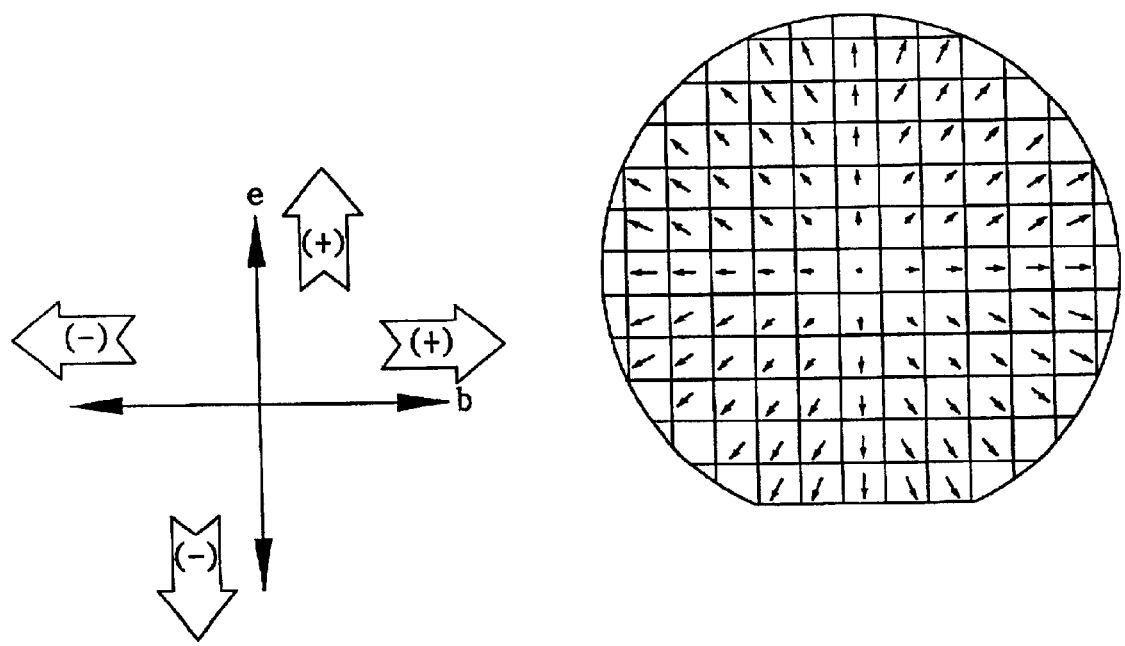
Figure 3:
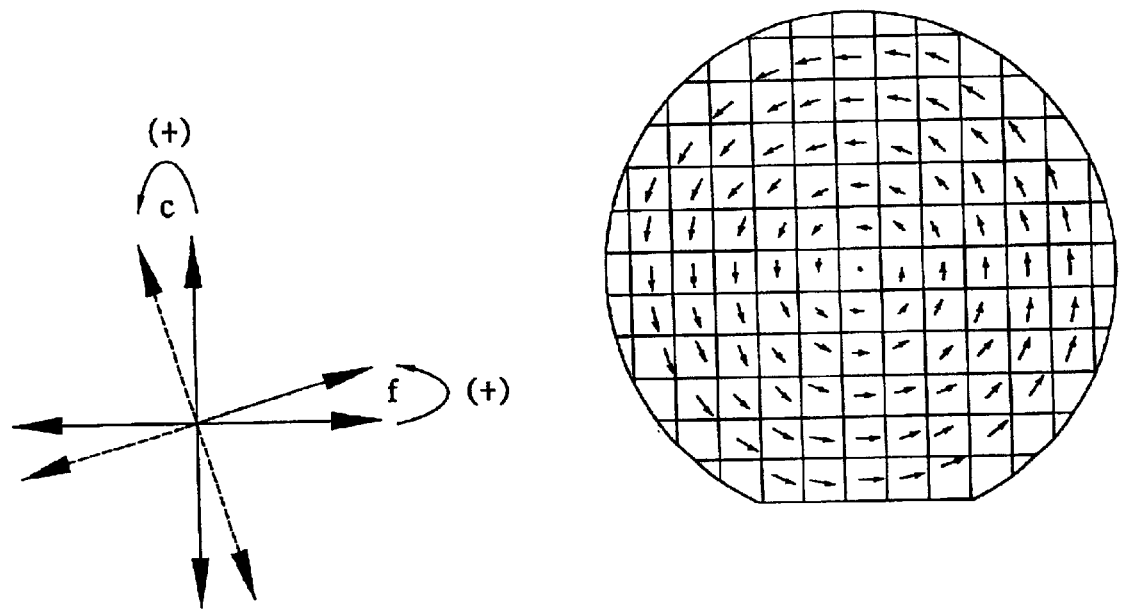
Figure 4:
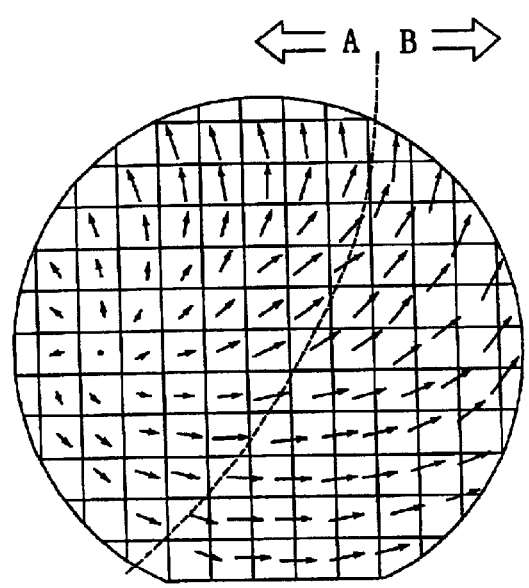
FIG. 4 is a plan illustrated by combination of respective overlay variables shown in FIGS. 1 through 3.
Figure 5:
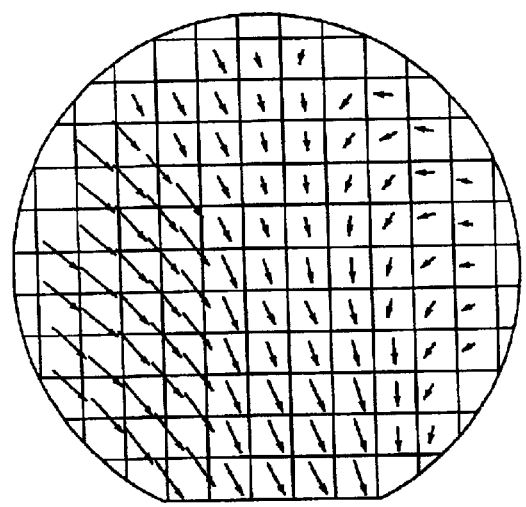
FIG. 5 is a plan for schematically illustrating a misalignment relationship determined by an irregular relationship of overlay variables.
Figure 6:
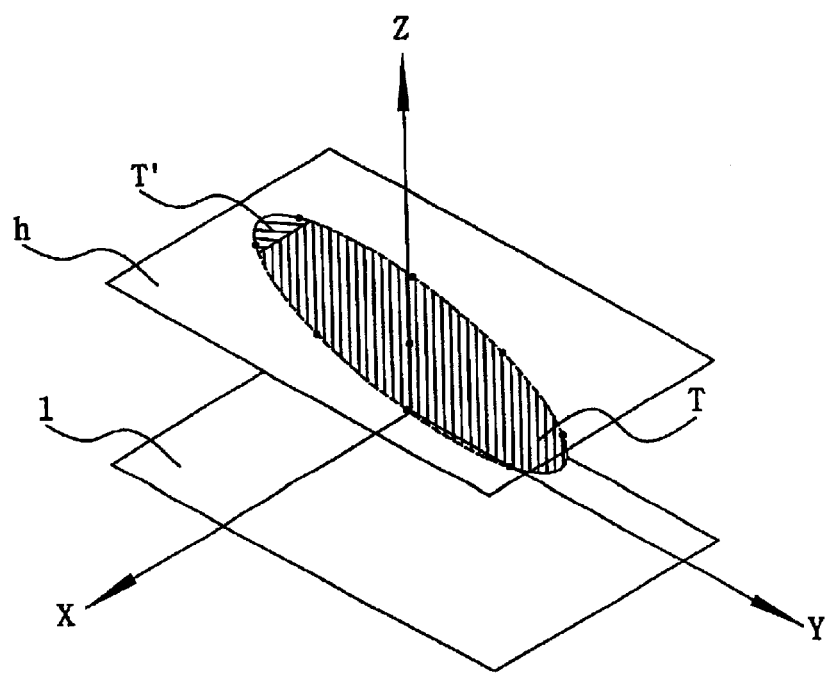
FIG. 6 is a graph for illustrating a three-dimensionally visualized instance of overlay variable relationship that has a statistical meaning of each shot region obtained through a calculation formula.
Figure 7:
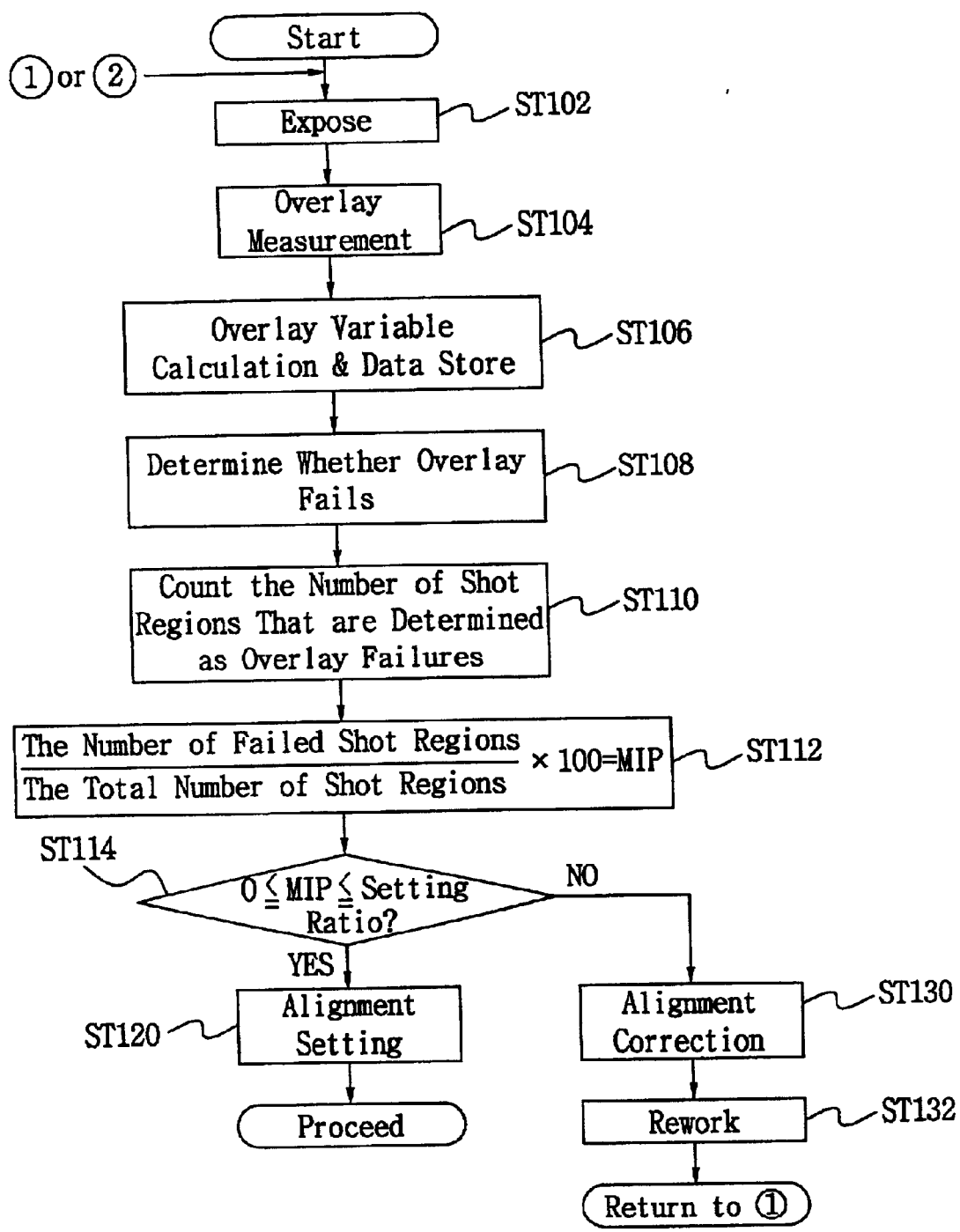
FIG. 7 is a sequential diagram for illustrating an alignment measuring method of a photolithography process in accordance with an embodiment of the present invention.

As shown in FIG. 7, an alignment measuring method of a photolithography process in the present invention includes an exposure step ST102. In this step, ST102, a predetermined alignment process is performed with a reticle having a pattern image on a wafer provided for the photolithography process with its whole surface being covered with photoresist (ST102). Then, a photo-exposure is performed on the wafer, using a light source or the like. Next an overlay measurement step ST104 determines whether a pattern image transcribed subsequently is accurately overlaid correspondingly to respective shot regions of the wafer (ST104).

Then, overlay variables are respectively obtained with the misalignment amount resulting from the measurement step (ST106). At this time, each shot region means an area having a center and four edges on a wafer. If the overlay variables corresponding to each shot region are defined as five points, that is, a center and four edges of the shot region, they relate to functional values of those points which can be obtained according to regression formulas (math Formulas 1 and 2, above) for the misalignment amount of the pre-existing pattern layer and a transcribed pattern image.

Therefore, the above-obtained misalignment amount and its relevant overly variables for each shot region are stored as data, along with coordinates of each shot region (ST108).

As a result, the number of shot regions determined as overlay defects, out of the total shot regions of the wafer, is counted (ST110). If the counted number of shot regions having an overlay defect is again estimated in percentage by division against the total number of shot regions of the wafer, the result is termed a misalign information percentage (hereinafter, referred to as MIP) (ST112).

At this time, the smaller the obtained value of MIP is, the better the manufacturing yield is. Besides, the MIP value can be used as a judgmental factor to determine the possibility of rework of the wafer whose overlay variables have been measured.

In other words, the possibility of rework is determined by comparing the resultant MIP value to a preset value (ST114). As the MIP value is closer to 0, there will be no need for rework. Therefore, an alignment value is set to keep the alignment rate for another wafer to which the same process will be performed (ST120). Then, it is determined that a development process will follow.

Figure 8:
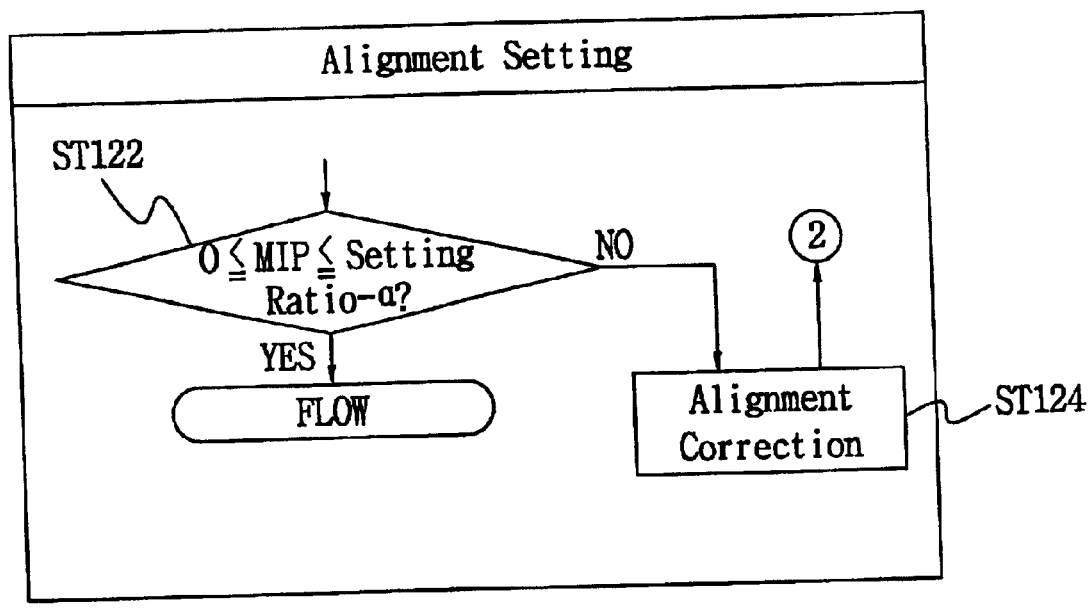
FIG. 8 is a sequential diagram for illustrating a conversion instance of an alignment setting shown in FIG. 7.

The aforementioned process of setting alignment values is performed to improve the manufacturing yield that requires a discreet attitude for determination. As shown in FIG. 8, the alignment setting process includes a step of determining whether the MIP value falls into a further narrowly set range of values (ST122). If a correction step is considered to be possible, a step of correcting the alignment value over again should be performed at least one time. If the result of the correction step appears to increase the MIP value, the alignment value should be kept at its initial one to proceed to the following processes.

At this time, when the aforementioned MIP value is greater than the preset value, data relating to the stored overlay variables are statistically calculated for correction of alignment values (ST130) as shown in FIG. 7. The current wafer whose overlay has been measured will go through a serial rework step of stripping the doped photoresist, washing and coating photoresist over again (ST132) and the aforementioned alignment measurement process is then repeated.

On the other hand, in the above-described process, there may be over a certain number of shot regions greater than expected, so that there may be another problem of causing a delay in the work time of overlay measurement.

Figure 9:
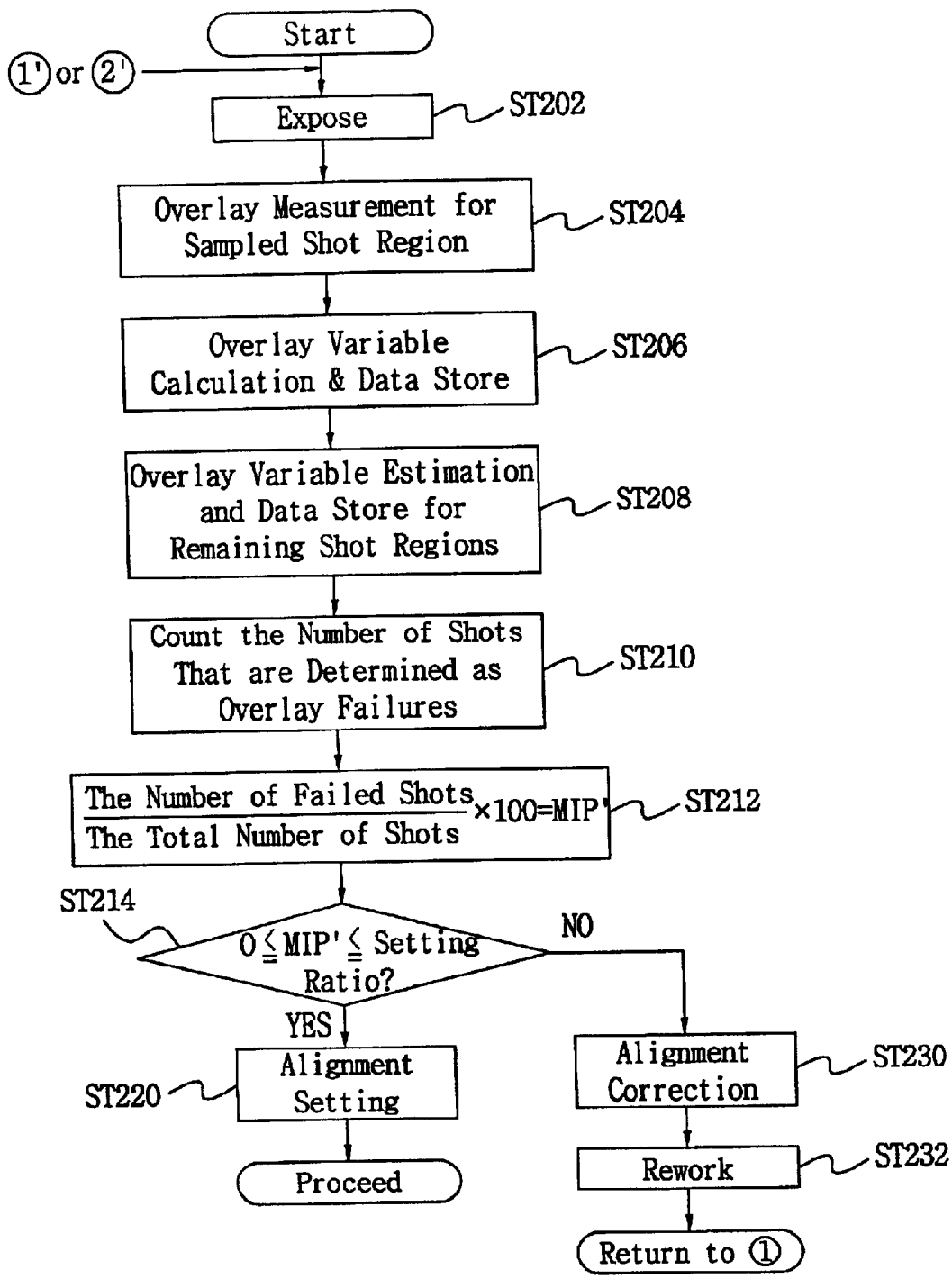
FIG. 9 is a sequential diagram for illustrating an alignment measuring method of a photolithography in accordance with another embodiment of the present invention.
Figure 10:
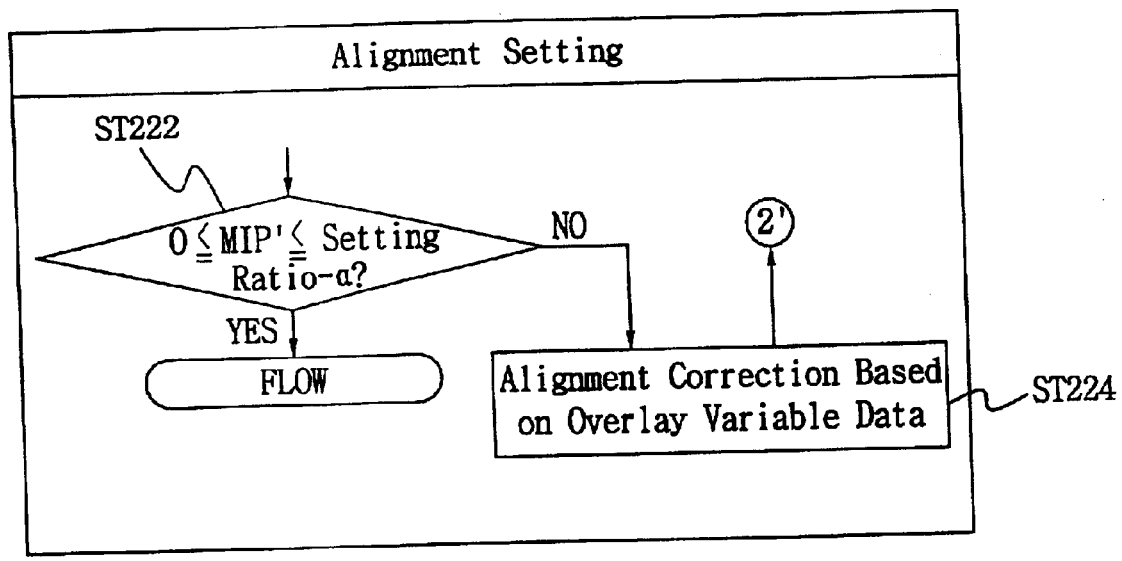
FIG. 10 is a sequential diagram for illustrating a conversion instance of an alignment setting shown in FIG. 9.

FIGS. 9 and 10 illustrate an overlay measurement process in accordance with another embodiment of the present invention, which will now be described.

A wafer having photoresist coated on its whole surface provided for a photolithography process goes through a predetermined alignment step along with reticle having a pattern image a photo-exposure step with a light source or the like (ST202). Then, a measurement is performed to check whether a transcribed pattern image is accurately overlaid correspondingly to each shot region of the wafer in an alignment measurement, by sampling particular shot regions out of all the shot regions of the wafer (ST204).

Then, overlay variables are calculated for the sampled shot regions on the basis of the result of such a measurement step (ST206). At this time, each shot region has a center and four edges on the wafer. If the overlay variables corresponding to each shot region are defined as five points, that is, a center and four edges of the shot region, they relate to functional values of those points which can be obtained according to regression formulas (math Formulas 1 and 2, above) for the misalignment amount of the pre-existing pattern layer and transcribed pattern image. Therefore, the above-obtained overly variables are stored as data along with coordinates of each shot region.

Besides, the misalignment amount of the remaining non-sampled shot regions, excluded in the sampling process, can be obtained by applying respective coordinate values of the remaining shot regions to a regression formula (math Formula 1) used to calculate the misalignment amount relative to at least one or more shot regions that are close to the sampled shot region (ST208). Then, the above-obtained misalignment amount and its relevant overlay variables are stored as data along with coordinates of each non-sampled shot region that was excluded in the sampling process.

When the misalignment amount of each shot region on the total area of the wafer is obtained by the prior steps, the possibility of overlay to each shot region is determined. As a result, the number of shot regions determined as overlay defects is checked (ST210).

If the counted number of shot regions is again estimated in percentage by division against the number of total shot regions of the wafer, the result is termed MIP (ST212).

At this time, if the MIP falls below a preset value, the current alignment value is set up to perform the alignment and photo-exposure steps onto other wafers that have been through the identical processes, and, simultaneously a development step and the like will be followed.

Furthermore, in order to make a minimum MIP relative to the set alignment value, as shown in FIG. 10, it is determined whether the MIP value falls within a smaller preset value (ST222). If it is determined that a correction is possible, a step of correcting the alignment value (ST224) is performed at least more than once. If the result of the correction step appears to increase the MIP value, the alignment value should be kept at its initial value to proceed to the following processes.

At this time, when the aforementioned MIP value exceeds the preset value, data relating to the stored overlay variables are re-corrected alignment values (ST230), as shown in FIG. 9. The current wafer whose overlay has been measured will go through a serial rework step of stripping the doped photoresist, washing and coating photoresist over again (ST232) and the aforementioned alignment measurement process is then repeated.

As described in the preferred embodiments of the present invention above, there are advantages of estimating the misalignment amount of the unmeasured shot regions with data of the sampled and measured shot regions, discriminating the possibility of overlay defects of each shot region and determining fast and conveniently the necessity of rework with a MIP value, to thereby shorten the time of manufacturing semiconductor devices, improve the reliability of judgment on rework due to exclusion of a worker's personal judgment, and make progress in cost effectiveness of rework and manufactured yield.

Having been described specific preferred embodiments of the invention, it should be understood that the invention is not limited to those precise embodiments, and that various changes and modifications may be effected therein by one skilled in the art without departing from the scope or spirit of the invention as defined in the appended claims.

What is claimed is:

1. An alignment measuring method of a photolithography process, comprising:

measuring an overlay state of each pattern image transcribed to every shot region of a wafer;

counting a number of shot regions judged as overlay defects with a misalignment amount of each measured shot region;

calculating in percentage a number of shot regions judged as overlay defects against a total number of shot regions of the wafer; and comparing the calculated percentage value with a preset percentage value to determine whether the wafer should be reworked.

2. An alignment measuring method of a photolithography process, comprising:

measuring an overlay state of a pattern image transcribed to each sampled shot region, sampled in a predetermined number, out of all shot regions of a wafer;

obtaining overlay variables respectively for all shot regions sampled with measured misalignment amount;

obtaining overlay variables respectively with misalignment degrees for all of the sampled shot regions and estimating a misalignment degree for a remainder of non-sampled shot regions by using the obtained overlay variables;

counting a number of shot regions determined as overlay defects with a misalignment degree among the sampled shot regions, and the estimated misalignment degree of the remaining non-sampled shot regions;

calculating a percentage of shot regions determined as overlay defects against the total number of shot regions on the wafer; and comparing the calculated percentage with a preset percentage value to determine whether the wafer should be reworked.

3. The method, as defined in claim 2, wherein the measurement of the shot regions includes a characteristic that each alignment degree is obtained by separately comparing a center and edge coordinates of each shot region of a pre-existing pattern layer with those of a correspondingly transcribed pattern image.

4. The method, as defined in claim 2, wherein the overlay defect of shot regions are determined with any misalignment amount that is out of a preset range when the misalignment amounts are obtained by separately comparing a center and edge coordinates of each shot region of a pre-existing pattern layer with those of a correspondingly transcribed pattern image.

5. The method, as defined in claim 2, wherein the misalignment amount of the remainder of non-sampled shot regions is obtained by applying respective coordinate values used in calculation for the misalignment amount including overlay variables relative to nearby sampled shot regions.

6. The method, as defined in claim 2, wherein linear and non-linear misalignment components of each shot region are stored as data and statistically calculated to be used as alignment correction values for a subsequent photo-exposure step.

7. A method of determining alignment in a photolithography process for a wafer having a plurality of shot regions, including sampled shot regions and non-sampled shot regions, comprising:

measuring a misalignment amount for each sampled shot region;

estimating a misalignment amount for each non-sampled shot region;

comparing the misalignment amount of each shot region against a threshold, counting a shot region as an overlay defect when the corresponding misalignment degree exceeds the threshold, and calculating a number of shot regions having the overlay defect; and comparing the calculated number of shot regions having the overlay defect with a preset number; and determine that the wafer should be reworked when the number of shot regions having the overlay defect is greater than the preset number.

8. The method of claim 7, wherein measuring a misalignment degree for each sampled shot region comprises separately comparing a center and edge coordinates of each shot region of a pre-existing pattern layer with those of a correspondingly transcribed pattern image.

9. The method of claim 7, wherein estimating a misalignment amount for each non-sampled shot region comprises applying respective coordinate values used in calculation for the misalignment amount including overlay variables relative to nearby sampled shot regions.

10. The method of claim 7, wherein linear and non-linear misalignment components of each shot region are stored as data and statistically calculated to be used as alignment correction values for a subsequent photo-exposure step.

11. The method of claim 7, further comprising:

comparing the calculated number of shot regions having the overlay defect with a second preset number less than the first preset number; and when the calculated number of shot regions having the overlay is greater than the second preset number, correcting an alignment value to be used in subsequent steps of the photolithography process.

* * * * *